(12) United States Patent
Jo et al.

(10) Patent No.: US 12,396,334 B2
(45) Date of Patent: Aug. 19, 2025

(54) DISPLAY APPARATUS AND METHOD OF MANUFACTURING THE SAME

(71) Applicant: Samsung Display Co., Ltd., Yongin-Si (KR)

(72) Inventors: Won Je Jo, Ansan-si (KR); Young Ji Kim, Hwaseong-si (KR); Yi Seul Um, Chungcheongnam-do (KR); Young Hoon Lee, Gwangmyeong-si (KR); Seong Geun Won, Hwaseong-si (KR); Young Seo Choi, Yongin-si (KR); Hyun Min Hwang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 212 days.

(21) Appl. No.: 17/099,959

(22) Filed: Nov. 17, 2020

(65) Prior Publication Data
US 2021/0151531 A1  May 20, 2021

(30) Foreign Application Priority Data
Nov. 18, 2019 (KR) ........................ 10-2019-0147712

(51) Int. Cl.
*H01L 27/32* (2006.01)
*H10K 50/844* (2023.01)
(Continued)

(52) U.S. Cl.
CPC ......... *H10K 59/124* (2023.02); *H10K 50/844* (2023.02); *H10K 50/87* (2023.02);
(Continued)

(58) Field of Classification Search
CPC ............. H01L 27/3246; H01L 51/5253; H01L 51/529; H01L 51/56; H01L 2227/323;
(Continued)

(56) References Cited

U.S. PATENT DOCUMENTS

| 8,717,513 B2 | 5/2014 | Park et al. |
| 2010/0315570 A1* | 12/2010 | Mathew ................ G06F 1/1637 257/E27.111 |
| 2017/0200914 A1* | 7/2017 | Min ........................ H10K 71/00 |
| 2017/0237038 A1 | 8/2017 | Kim et al. |

(Continued)

FOREIGN PATENT DOCUMENTS

| JP | 2019139232 A | 8/2019 |
| KR | 100885843 B1 | 2/2009 |

(Continued)

*Primary Examiner* — Dzung Tran
(74) *Attorney, Agent, or Firm* — CANTOR COLBURN LLP

(57) ABSTRACT

A display apparatus includes a base substrate including a hole area through which light passes, a hole peripheral area which is a non-display area surrounding the hole area, and a display area surrounding the hole peripheral area, where the display area includes pixels to display an image, an insulating layer disposed on the base substrate in the hole peripheral area and the display area except for the hole area, a via insulating layer disposed on the insulating layer in the hole peripheral area and the display area except for the hole area, and a thin film encapsulation layer including first and second inorganic films which are disposed in the hole peripheral area and the display area except for the hole area on the base substrate on which the via insulating layer is disposed.

14 Claims, 15 Drawing Sheets

(51) Int. Cl.
*H10K 50/87* (2023.01)
*H10K 59/122* (2023.01)
*H10K 59/124* (2023.01)
*H10K 59/80* (2023.01)
*H10K 71/00* (2023.01)
*H10K 59/12* (2023.01)
*H10K 59/65* (2023.01)

(52) U.S. Cl.
CPC ....... *H10K 59/122* (2023.02); *H10K 59/8794* (2023.02); *H10K 71/00* (2023.02); *H10K 59/1201* (2023.02); *H10K 59/65* (2023.02); *H10K 59/8731* (2023.02)

(58) Field of Classification Search
CPC ............... H10K 59/124; H10K 59/122; H10K 59/8794; H10K 59/1201; H10K 59/65; H10K 71/00
USPC ........................................................... 257/88
See application file for complete search history.

(56) References Cited

U.S. PATENT DOCUMENTS

| | | | |
|---|---|---|---|
| 2017/0287992 A1 | 10/2017 | Kwak et al. | |
| 2017/0288004 A1* | 10/2017 | Kim | H01L 27/3276 |
| 2017/0309651 A1* | 10/2017 | Kim | G02F 1/1345 |
| 2018/0089485 A1* | 3/2018 | Bok | G06F 3/0445 |
| 2018/0123086 A1* | 5/2018 | Oh | H01L 27/3248 |
| 2019/0051859 A1* | 2/2019 | Choi | H01L 51/5253 |
| 2019/0245015 A1 | 8/2019 | Lee et al. | |
| 2019/0252475 A1 | 8/2019 | Sung et al. | |
| 2019/0288047 A1* | 9/2019 | Jeong | H01L 51/5253 |
| 2019/0355799 A1* | 11/2019 | Jeong | H01L 27/3262 |
| 2020/0144535 A1* | 5/2020 | Kim | H01L 51/5246 |
| 2020/0295102 A1* | 9/2020 | Qin | H10K 59/122 |
| 2021/0036068 A1* | 2/2021 | Zhao | H10K 59/124 |

FOREIGN PATENT DOCUMENTS

| | | |
|---|---|---|
| KR | 1020170096646 A | 8/2017 |
| KR | 1020170111827 A | 10/2017 |
| KR | 1020190073716 A | 6/2019 |
| KR | 1020190096467 A | 8/2019 |

\* cited by examiner

DISPLAY APPARATUS AND METHOD OF MANUFACTURING THE SAME

This application claims priority to Korean Patent Application No. 10-2019-0147712, filed on Nov. 18, 2019, and all the benefits accruing therefrom under 35 U.S.C. § 119, the content of which in its entirety is herein incorporated by reference.

BACKGROUND

1. Field

Embodiments relate generally to a display apparatus and a method of manufacturing the display apparatus. More particularly, embodiments of the invention relate to a display apparatus including a hole area and a method of manufacturing the display apparatus.

2. Description of the Related Art

Recently, as the technology improves, display products having smaller sizes, lighter weights, and superior performance have been produced. Conventional cathode ray tube (CRT) televisions have been widely used for display apparatuses with many advantages in terms of performance and price. Recently, however, a display apparatus such as a plasma display apparatus, a liquid crystal display apparatus, and an organic light emitting diode display apparatus that overcomes weak points of the CRT in terms of miniaturization or portability and has advantages such as miniaturization, light weight, and low power consumption has been spotlighted.

SUMMARY

Recently, a bezel-less display apparatus, a display apparatus including a notch, and the like have been developed to enlarge a display area of the display apparatus. In a display apparatus, for example, a hole may be formed in a display area to arrange a camera or the like in the hole, and the like to enlarge the display area. In such a display apparatus, it is desired to implement a panel design which takes into consideration the existence of the hole.

Embodiments provide a display apparatus including a hole area located in a display area, where a manufacturing cost of the display apparatus is reduced and a display quality of the display apparatus is improved.

Embodiments provide a method of manufacturing the display apparatus.

According to an embodiment, a display apparatus includes a base substrate including a hole area through which light passes, a hole peripheral area which is a non-display area surrounding the hole area, and a display area surrounding the hole peripheral area, where the display area includes a plurality of pixels to display an image, an insulating layer disposed on the base substrate in the hole peripheral area and the display area except for the hole area, a via insulating layer disposed on the insulating layer in the hole peripheral area and the display area except for the hole area, and a thin film encapsulation layer including a first inorganic film and a second inorganic film which are disposed in the hole peripheral area and the display area except for the hole area on the base substrate on which the via insulating layer is disposed.

In an embodiment, the base substrate may be a rigid substrate.

In an embodiment, a roughness of a surface of the base substrate in the hole area may be greater than a roughness of the surface of the base substrate in the hole peripheral area and the display area.

In an embodiment, the display apparatus may further include a first electrode disposed on the via insulating layer in the display area, a light emitting layer disposed on the first electrode, and a second electrode disposed on the light emitting layer.

In an embodiment, a groove surrounding the hole area may be defined in the via insulating layer in the hole peripheral area.

In an embodiment, the second electrode may have a disconnected portion disposed in the groove of the via insulating layer.

In an embodiment, the second electrode may be spaced apart from the hole area.

In an embodiment, the light emitting layer may include a hole injection layer, a hole transport layer, an electron transport layer, and an electron injection layer which are disposed between the second electrode and the base substrate, where the light emitting layer may be disposed to correspond to the plurality of pixels. In such an embodiment, the hole injection layer, the hole transport layer, the electron transport layer, and the electron injection layer may be spaced apart from the hole area.

In an embodiment, the first inorganic film of the thin film encapsulation layer may be disposed directly on the base substrate in the hole peripheral area.

In an embodiment, the hole peripheral area may include a heat affected zone at a portion of the hole peripheral area in contact with the hole area. In such an embodiment, the via insulating layer may be carbonized in the heat affected zone.

In an embodiment, the hole peripheral area may include a heat affected zone at a portion of the hole peripheral area in contact with the hole area. In such an embodiment, a height of the via insulating layer in the heat affected zone may be greater than a height of the via insulating layer in the display area and the hole peripheral area.

In an embodiment, the display apparatus may further include a cover window disposed on the thin film encapsulation layer and an optical clear adhesive film disposed between the thin film encapsulation layer and the cover window. In such an embodiment, the base substrate and the cover window may be spaced apart from each other in the hole area.

In an embodiment, a hole optical clear adhesive film may be disposed between the base substrate and the cover window in the hole area.

In an embodiment, the display apparatus may further include a cover window disposed on the thin film encapsulation layer and an optical clear resin disposed between the cover window and the thin film encapsulation layer. In such an embodiment, the optical clear resin may be disposed between the base substrate and the cover window in the hole area.

According to an embodiment, a method of manufacturing a display apparatus including a hole area through which light passes, a hole peripheral area which is a non-display area surrounding the hole area, and a display area surrounding the hole peripheral area, where the display area includes a plurality of pixels to display an image, may include providing an insulating layer on a base substrate, providing a via insulating layer on the insulating layer, sequentially providing a first electrode, a light emitting layer, and a second electrode on the via insulating layer, providing a thin film encapsulation layer including a first inorganic film and a second inorganic film on the second electrode, and exposing a top surface of the base substrate by removing layers on the base substrate in the hole area.

In an embodiment, the exposing the top surface of the base substrate may include removing the layers on the base substrate in the hole area by using a laser. In such an embodiment, a roughness of a surface of the base substrate in the hole area may be greater than a roughness of the surface of the base substrate in the hole peripheral area and the display area.

In an embodiment, when the top surface of the base substrate is exposed, a heat affected zone may be formed at a portion of the hole peripheral area in contact with the hole area by the laser. In such an embodiment, the via insulating layer may be carbonized in the heat affected zone.

In an embodiment, the providing the via insulating layer may further include forming a groove surrounding the hole area in the via insulating layer in the hole peripheral area.

In an embodiment, the exposing the top surface of the base substrate may include removing layers on the base substrate in a part of the hole peripheral area after the second electrode is provided.

In an embodiment, the method may further include providing an optical clear adhesive film or an optical clear resin on the thin film encapsulation layer and attaching a cover window onto the optical clear adhesive film or the optical clear resin.

In embodiments of the invention, a display apparatus may include a base substrate which is a rigid substrate and seal a light emitting layer by using a thin film encapsulation layer while forming a hole area in which an optical module is to be disposed such that a manufacturing cost of the display apparatus may be reduced and a display quality thereof may be improved. In such embodiments, layered structures except for the base substrate may be removed from the hole area, such that performance of the optical module may be prevented from deteriorating due to an interference phenomenon or the like caused by an air gap.

DETAILED DESCRIPTION

Figure 1:
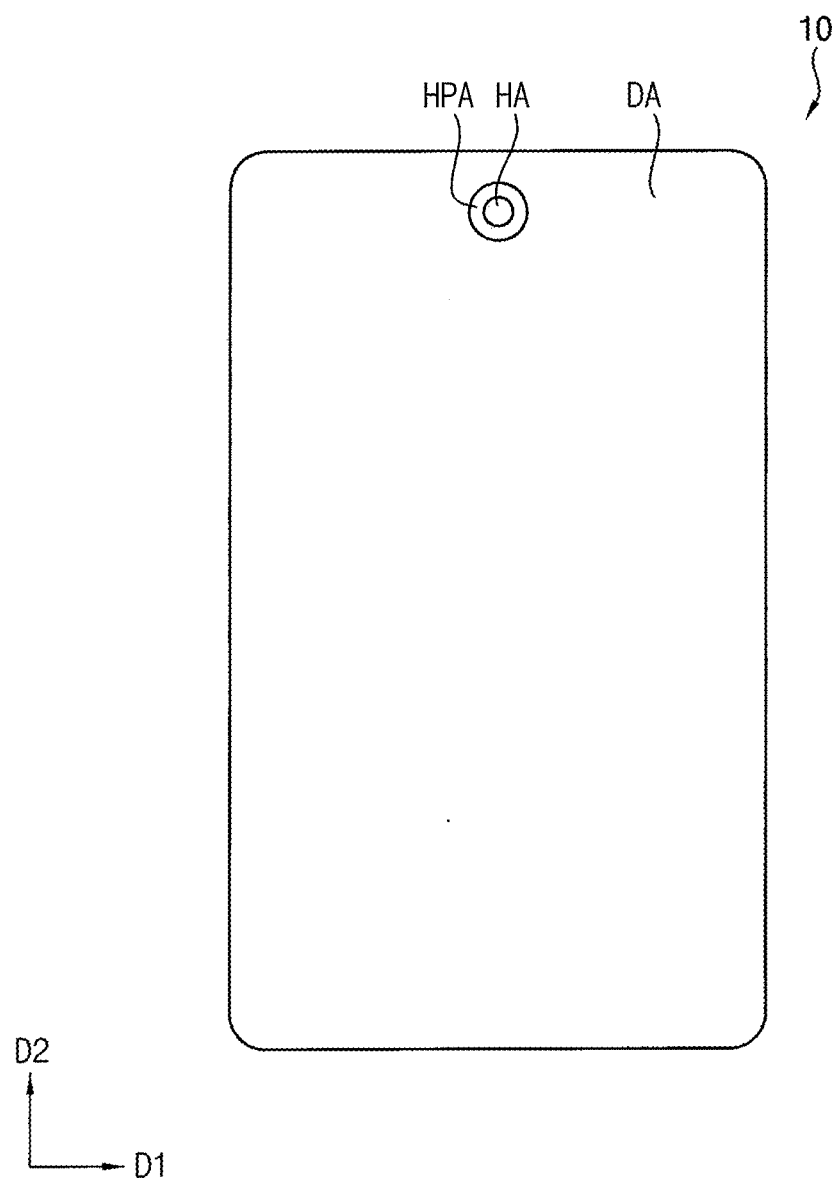
FIG. 1 is a plan view showing a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a plan view showing a display apparatus according to an embodiment.

Referring to FIG. 1, an embodiment of a display apparatus 10 may include a display area DA, a hole peripheral area HPA defined in the display area DA, and a hole area HA defined in the hole peripheral area HPA.

The hole area HA may allow light to pass therethrough, so that an optical module (see 400 in FIG. 2) may overlap, e.g., be disposed below, the hole area HA. The hole peripheral area HPA is a non-display area surrounding the hole area HA, and signal wires and the like may be disposed in the hole peripheral area HPA.

The display area DA is an area for displaying an image, and a plurality of pixels (not shown) may be disposed in the display area DA. Each of the pixels may include a light emitting structure, and a pixel circuit including a thin film transistor electrically connected to the light emitting structure. The display area DA may be on a plane defined by a first direction D1 and a second direction D2 perpendicular to the first direction D1 to have a rectangular shape elongated in the second direction D2. A corner portion of the display area DA may have a rounded shape.

In an embodiment, although not shown, a peripheral area, which is a non-display area in which an image is not displayed, may be defined along an edge of the display apparatus 10.

Figure 2:
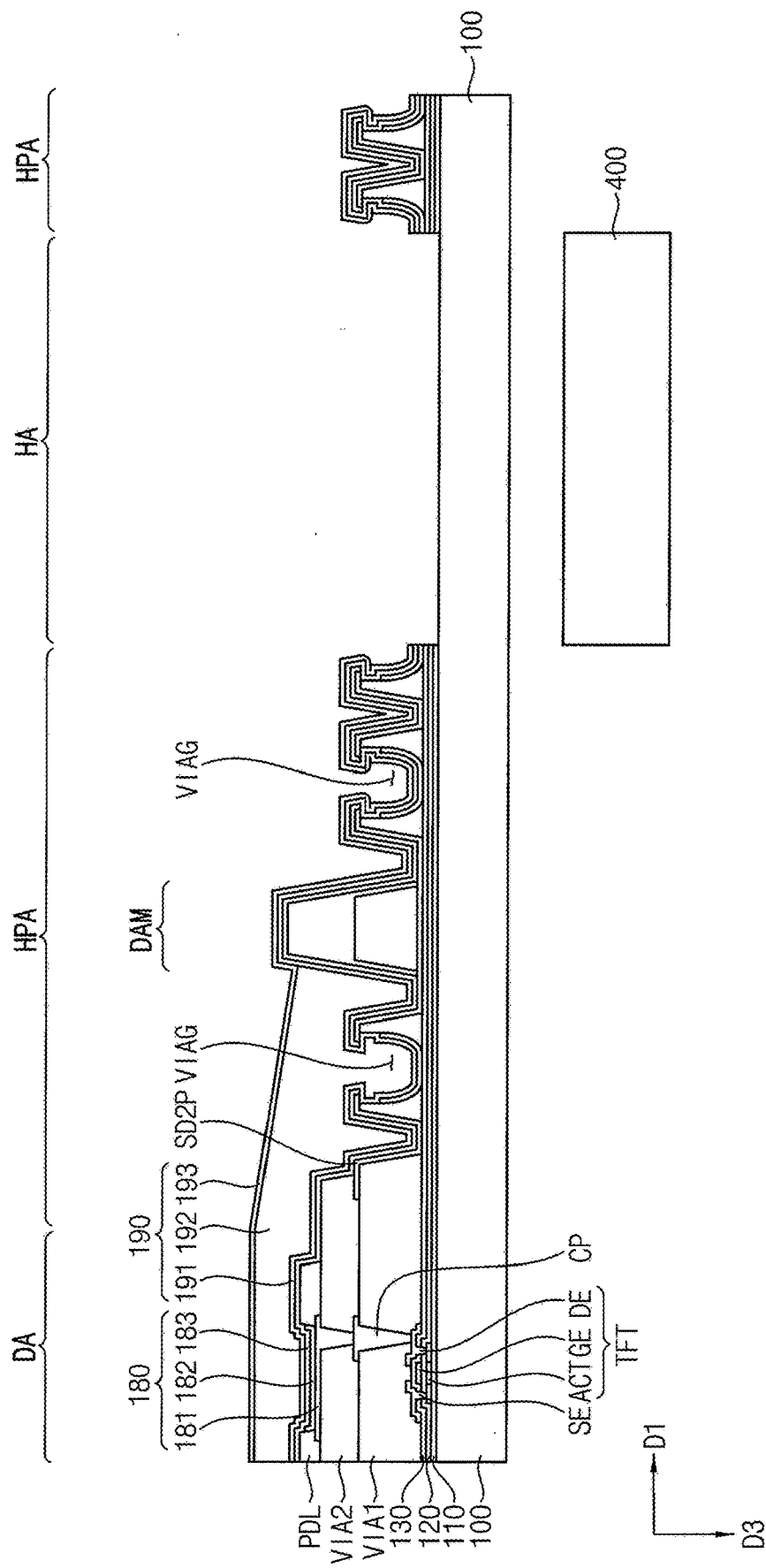
FIG. 2 is a sectional view showing a periphery of a hole area of the display apparatus of FIG. 1.

FIG. 2 is a sectional view showing a periphery of a hole area of the display apparatus of FIG. 1.

Referring to FIGS. 1 and 2, an embodiment of the display apparatus may include a base substrate 100, a buffer layer 110, an active pattern ACT of a thin film transistor TFT, a first insulating layer 120, a gate conductive layer, a second insulating layer 130, a first source-drain conductive layer, a first via insulating layer VIA1, a second source-drain conductive layer, a second via insulating layer VIA2, a pixel defining layer PDL, a light emitting structure 180, and a thin film encapsulation layer 190. The display apparatus may further include an optical module 400.

The base substrate 100 may include or be formed of a transparent or opaque material. The base substrate 100 may be a rigid substrate. In one embodiment, for example, the base substrate 100 may be a quartz substrate, a synthetic quartz substrate, a calcium fluoride substrate, a fluorine-doped quartz substrate (F-doped quartz substrate), a soda lime glass substrate, a non-alkali glass substrates, or the like.

The buffer layer 110 may be disposed on the base substrate 100 in the hole peripheral area HPA and the display area DA except for the hole area HA. The buffer layer 110 may effectively prevent metal atoms or impurities from diffusing from the base substrate 100 into the active pattern ACT, and may control a heat transfer rate during a crystallization process for forming the active pattern ACT to obtain a substantially uniform active pattern ACT. The buffer layer 110 may be provided or formed by using an inorganic insulating material.

The active pattern ACT may be disposed on the buffer layer 110 in the display area DA. The active pattern ACT may include amorphous silicon or polycrystalline silicon. In an alternative embodiment, the active pattern ACT may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). The active pattern ACT may include a drain region and a source region, which are doped with impurities, and a channel region disposed between the drain region and the source region.

The first insulating layer 120 may be disposed on the buffer layer 110 in the hole peripheral area HPA and the display area DA except for the hole area HA. The first insulating layer 120 may be disposed along a profile of the active pattern ACT with a substantially uniform thickness to cover the active pattern ACT on the buffer layer 110. The first insulating layer 120 may have a multilayer structure or include a plurality of layers. The first insulating layer 120 may be provided or formed by using an inorganic insulating material.

The gate conductive layer may be disposed on the first insulating layer 120. The gate conductive layer may include a gate electrode GE which overlaps the active pattern ACT of the thin film transistor TFT, and a signal wire (not shown) disposed in the hole peripheral area HPA. The gate conductive layer may be provided or formed by using a metal, an alloy, metal nitride, conductive metal oxide, a transparent conductive material, or the like.

The second insulating layer 130 may be disposed in the hole peripheral area HPA and the display area DA except for the hole area HA on the first insulating layer 120 on which the gate conductive layer is disposed. The second insulating layer 130 may be disposed along a profile of the gate conductive layer with a substantially uniform thickness to cover the gate conductive layer on the first insulating layer 120. The second insulating layer 130 may have a multilayer structure or include a plurality of layers. The second insulating layer 130 may be provided or formed by using an inorganic insulating material.

The first source-drain conductive layer may be disposed on the second insulating layer 130. The first source-drain conductive layer may include a source electrode SE and a drain electrode DE, which are electrically connected to the source region and the drain region of the active pattern ACT of the thin film transistor TFT, respectively, through contact holes formed through the second insulating layer 130 and the first insulating layer 120. The first source-drain conductive layer may further include a signal wire (not shown) disposed in the hole peripheral area HPA. The first source-drain conductive layer may be provided or formed by using a metal, an alloy, metal nitride, conductive metal oxide, a transparent conductive material, or the like.

The first via insulating layer VIA1 may be disposed in the hole peripheral area HPA and the display area DA except for the hole area HA on the second insulating layer 130 on which the first source-drain conductive layer is disposed. The first via insulating layer VIA1 may have a single-layer structure, and may also have a multilayer structure including at least two insulating films. The first via insulating layer VIA1 may be formed by using an organic material such as a photoresist, an acryl-based resin, a polyimide-based resin, a polyamide-based resin, and a siloxane-based resin.

A groove VIAG surrounding the hole area HA may be defined or formed in the first via insulating layer VIA1 in the hole peripheral area HPA. As shown in the drawings, the groove VIAG may be defined or formed through the first via insulating layer VIA1 to expose the second insulating layer 130. In an embodiment, a plurality of grooves VIAG may be defined or formed.

The second source-drain conductive layer may be disposed on the first via insulating layer VIA1. The second source-drain conductive layer may include a contact pad CP disposed in the display area DA, and a pattern SD2P disposed on the groove VIAG of the first via insulating layer VIA1 in the hole peripheral area HPA. The contact pad CP may be electrically connected to the drain electrode DE of the thin film transistor TFT through a contact hole defined through the first via insulating layer VIA1. The pattern SD2P may have an undercut adjacent to the groove VIAG. Accordingly, some layers of the light emitting structure 180, which will described below, may have a structure disconnected in the groove VIAG. The second source-drain conductive layer may further include a signal wire (not shown) disposed in the hole peripheral area HPA. The second source-drain conductive layer may be provided or formed by using a metal, an alloy, metal nitride, conductive metal oxide, a transparent conductive material, or the like.

The second via insulating layer VIA2 may be disposed in the hole peripheral area HPA and the display area DA except for the hole area HA on the first via insulating layer VIA1 on which the second source-drain conductive layer is disposed. The second via insulating layer VIA2 may have a single-layer structure, and may also have a multilayer structure including at least two insulating films. The second via insulating layer VIA2 may be provided or formed by using an organic material such as a photoresist, an acryl-based resin, a polyimide-based resin, a polyamide-based resin, and a siloxane-based resin.

The light emitting structure 180 may include a first electrode 181, a light emitting layer 182, and a second electrode 183.

The first electrode 181 may be disposed on the second via insulating layer VIA2. The first electrode 181 may be electrically connected to the thin film transistor TFT. In an embodiment, the first electrode 181 may be formed by using a reflective material or a transmissive material depending on a light emitting scheme of the display apparatus. In one embodiment, for example, the first electrode 181 may include at least one material selected from aluminum, an aluminum-containing alloy, aluminum nitride, silver, a silver-containing alloy, tungsten, tungsten nitride, copper, a copper-containing alloy, nickel, chromium, chromium nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and the like. Such materials may be used alone or in combination with each other. In an embodiment, the first electrode 181 may have a single-layer structure or a multilayer structure including a metal film, an alloy film, a metal nitride film, a conductive metal oxide film, and/or a transparent conductive material film.

The pixel defining layer PDL may be disposed on the second via insulating layer VIA2 on which the first electrode 181 is disposed. The pixel defining layer PDL may be provided or formed by using an organic material and the like. In one embodiment, for example, the pixel defining layer PDL may be provided or formed by using a photoresist, a polyacryl-based resin, a polyimide-based resin, an acryl-based resin, a silicone compound, or the like. According to an embodiment, the pixel defining layer PDL may be etched to form an opening which partially exposes the first electrode 181.

At least one selected from the first via insulating layer VIA1, the second via insulating layer VIA2, and the pixel defining layer PDL may defined or form a dam DAM in the hole peripheral area HPA. The dam DAM may effectively prevent an organic film 192 of the thin film encapsulation layer 190, which will be described below, from overflowing in a direction toward the hole area HA.

The light emitting layer 182 may be disposed on the first electrode 181 exposed through the opening of the pixel defining layer PDL. In an embodiment, the light emitting layer 182 may extend onto a side wall of the opening of the pixel defining layer PDL. In an embodiment, the light emitting layer 182 may have a multilayer structure including an organic emission layer EL, a hole injection layer HIL, a hole transport layer HTL, an electron transport layer ETL, an electron injection layer EIL, or the like. In an alternative embodiment, except for the organic emission layer, the hole injection layer, the hole transport layer, the electron transport layer, the electron injection layer, and the like may be commonly formed to correspond to a plurality of pixels. The organic emission layer of the light emitting layer 182 may be provided or formed by using light emitting materials for generating different color lights such as red light, green light, and blue light according to each of the pixels of the display apparatus. According to an alternative embodiment, the organic emission layer of the light emitting layer 182 may have a structure in which a plurality of light emitting materials for implementing different color lights such as red light, green light, and blue light are stacked to emit white light. In such an embodiment, the above light emitting structures may be commonly formed to correspond to the pixels, and the pixels may be classified by a color filter layer.

The second electrode 183 may be disposed on the pixel defining layer PDL and the light emitting layer 182. In an embodiment, the second electrode 183 may include a transmissive material or a reflective material depending on the light emitting scheme of the display apparatus. In one embodiment, for example, the second electrode 183 may include at least one material selected from aluminum, an aluminum-containing alloy, aluminum nitride, silver, a silver-containing alloy, tungsten, tungsten nitride, copper, a copper-containing alloy, nickel, chromium, chromium nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and the like. Such materials may be used alone or in combination with each other. In an embodiment, the second electrode 183 may have a single-layer structure or a multilayer structure including a metal film, an alloy film, a metal nitride film, a conductive metal oxide film, and/or a transparent conductive material film.

The thin film encapsulation layer 190 may be disposed on the second electrode 183. The thin film encapsulation layer 190 may effectively prevent moisture and oxygen from penetrating from an outside. The thin film encapsulation layer 190 may include at least one organic film and at least one inorganic film. The at least one organic film and the at least one inorganic film may be alternately stacked on each other. In one embodiment, for example, the thin film encapsulation layer 190 may include a first inorganic film 191, a second inorganic film 193, and an organic film 192 disposed between the first inorganic film 191 and the second inorganic film 193, but embodiments are not limited thereto. The thin film encapsulation layer 190 may not be formed in the hole area HA, so that a top surface of the base substrate 100 may be exposed in the hole area HA.

In an embodiment, roughness of the top surface of the base substrate 100 in the hole area HA may be greater than roughness of the surface of the base substrate 100 in the hole peripheral area HPA and the display area DA. In such an embodiment, the top surface of the base substrate 100 may be slightly damaged in a process of removing the layered structure disposed on the base substrate 100 in the hole area HA by using a laser or the like. In casein such an embodiment, an amount of the laser processing in the hole area HA may be greater in an outer peripheral portion which is an edge portion of the hole area HA (a portion adjacent to the hole peripheral area) than in a central portion of the hole area HA, so that the roughness may become greater in the outer peripheral portion than in the central portion of the hole area HA.

The optical module 400 may be disposed under the base substrate 100 (i.e., in a third direction D3) to overlap the hole area HA. In one embodiment, for example, the optical module 410 may include: a camera module for capturing (or recognizing) an image of an object; a face recognition sensor module for detecting a face of a user; a pupil recognition sensor module for detecting a pupil of the user; an acceleration sensor module and a geomagnetic sensor module for determining a movement of the display apparatus; a proximity sensor module and an infrared sensor module for detecting proximity with respect to a front side of the display apparatus; an illuminance sensor module for measuring a degree of brightness when left in a pocket or a bag; or the like.

Figure 3:
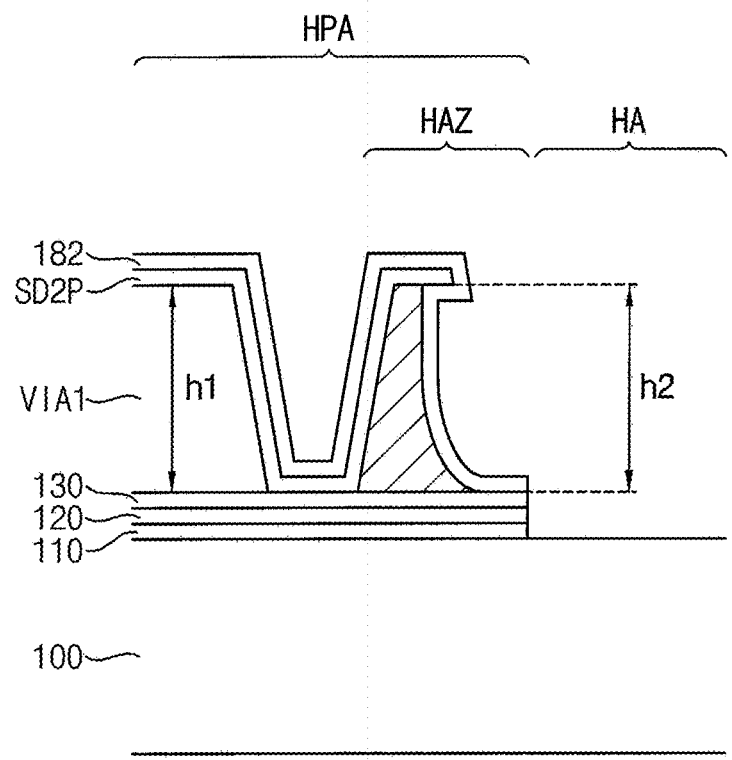
FIG. 3 is an enlarged sectional view showing a heat affected zone of the display apparatus of FIG. 2.

FIG. 3 is an enlarged sectional view showing a heat affected zone of the display apparatus of FIG. 2.

Referring to FIGS. 2 and 3, in an embodiment, the hole peripheral area HPA may include a heat affected zone HAZ formed at a portion of the hole peripheral area HPA making contact with the hole area HA. In the process of removing the layered structure disposed on the base substrate 100 in the hole area HA by using the laser or the like, the heat affected zone HAZ is an area in which heat affects the layered structure at a portion adjacent to the hole area HA.

The first via insulating layer VIA1 may be partially carbonized in the heat affected zone HAZ (a hatched portion in the drawing). A height h2 of the first via insulating layer VIA1 in the heat affected zone HAZ may be greater than a height h1 of the first via insulating layer VIA1 in the display area DA and the hole peripheral area HPA. In the heat affected zone HAZ, the first via insulating layer VIA1 including an organic insulating material that may be easily deformed by the heat may be thermally deformed, thereby being carbonized or swelled.

Figure 4:
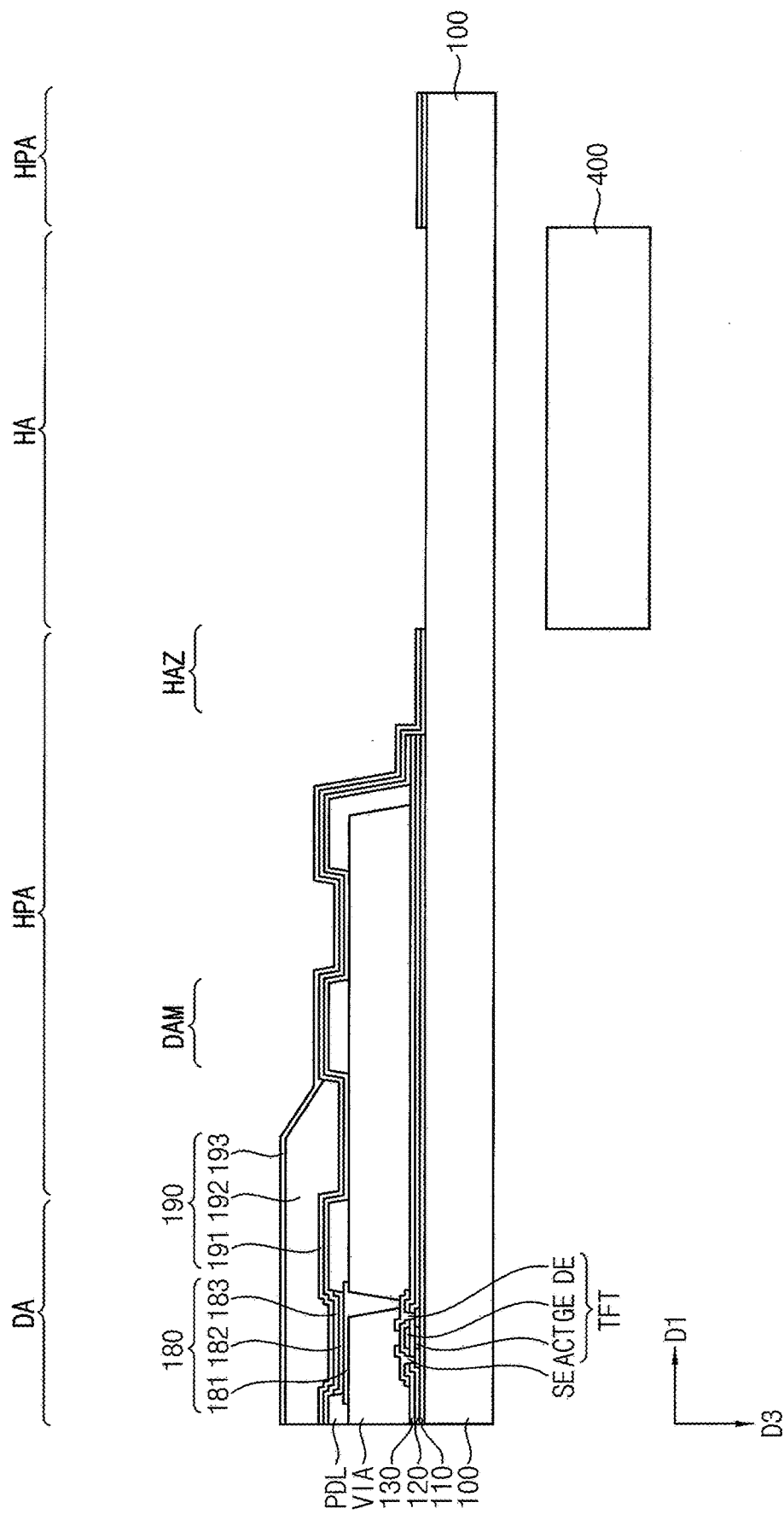
FIG. 4 is a sectional view showing a display apparatus according to an alternative embodiment.

FIG. 4 is a sectional view showing a display apparatus according to an alternative embodiment.

Referring to FIGS. 1 and 4, an embodiment of the display apparatus may include a base substrate 100, a buffer layer 110, an active pattern ACT of a thin film transistor TFT, a first insulating layer 120, a gate conductive layer, a second insulating layer 130, a source-drain conductive layer, a via insulating layer VIA, a pixel defining layer PDL, a light emitting structure 180, and a thin film encapsulation layer 190. The display apparatus may further include an optical module 400.

The base substrate 100 may include or be formed of a transparent or opaque material. The base substrate 100 may be a rigid substrate.

The buffer layer 110 may be disposed on the base substrate 100 in the display area DA and a portion of the hole peripheral area HPA except for the hole area HA. The buffer layer 110 may be spaced apart from the hole area HA.

The active pattern ACT of the thin film transistor TFT may be disposed on the buffer layer 110 in the display area DA.

The first insulating layer 120 may be disposed on the buffer layer 110 in the display area DA and a portion of the hole peripheral area HPA except for the hole area HA.

The gate conductive layer may be disposed on the first insulating layer 120. The gate conductive layer may include a gate electrode GE which overlaps the active pattern ACT of the thin film transistor TFT.

The second insulating layer 130 may be disposed in the display area DA and a portion of the hole peripheral area HPA except for the hole area HA on the first insulating layer 120 on which the gate conductive layer is disposed.

The source-drain conductive layer may be disposed on the second insulating layer 130. The source-drain conductive layer may include a source electrode SE and a drain electrode DE, which are electrically connected to the source region and the drain region of the active pattern ACT of the thin film transistor TFT, respectively, through contact holes defined through the second insulating layer 130 and the first insulating layer 120.

The via insulating layer VIA may be disposed in the display area DA and a portion of the hole peripheral area HPA except for the hole area HA on the second insulating layer 130 on which the source-drain conductive layer is disposed.

The light emitting structure 180 may include a first electrode 181, a light emitting layer 182, and a second electrode 183.

The first electrode 181 may be disposed on the via insulating layer VIA.

The pixel defining layer PDL may be disposed on the via insulating layer VIA on which the first electrode 181 is disposed.

The pixel defining layer PDL may define or form a dam DAM in the hole peripheral area HPA.

The light emitting layer 182 may be disposed on the first electrode 181 exposed through an opening of the pixel defining layer PDL.

The second electrode 183 may be disposed on the pixel defining layer PDL and the light emitting layer 182.

The thin film encapsulation layer 190 may be disposed on the second electrode 183. The thin film encapsulation layer 190 may include at least one organic film and at least one inorganic film. The at least one organic film and the at least one inorganic film may be alternately stacked on each other. In one embodiment, for example, the thin film encapsulation layer 190 may include a first inorganic film 191, a second inorganic film 193, and an organic film 192 disposed between the first inorganic film 191 and the second inorganic film 193, but embodiments are not limited thereto.

The first inorganic film 191 of the thin film encapsulation layer 190 may make contact with the base substrate 100 or be disposed directly on the base substrate 100 in the hole peripheral area HPA.

In such an embodiment, the light emitting layer 182 may include a hole injection layer, a hole transport layer, an electron transport layer, and an electron injection layer which are disposed between the second electrode 183 and the base substrate 100 and formed to correspond to a plurality of pixels. Since the light emitting layer 182 is cut away together with the second electrode 183 during a manufacturing process to be spaced apart from the hole area HA in the hole peripheral area HPA, an organic material of the light emitting layer 182 may be effectively prevented from being affected by external influences from the hole area HA.

In an embodiment, in a process of removing a layered structure disposed on the base substrate 100 in the hole area HA by using a laser or the like, only the first inorganic film 191 and the second inorganic film 193 of the thin film encapsulation layer 190 are disposed in a heat affected zone HAZ in which heat affects the layered structure at a portion adjacent to the hole area HA, so that an influence due to thermal deformation may be minimized.

Figure 5:
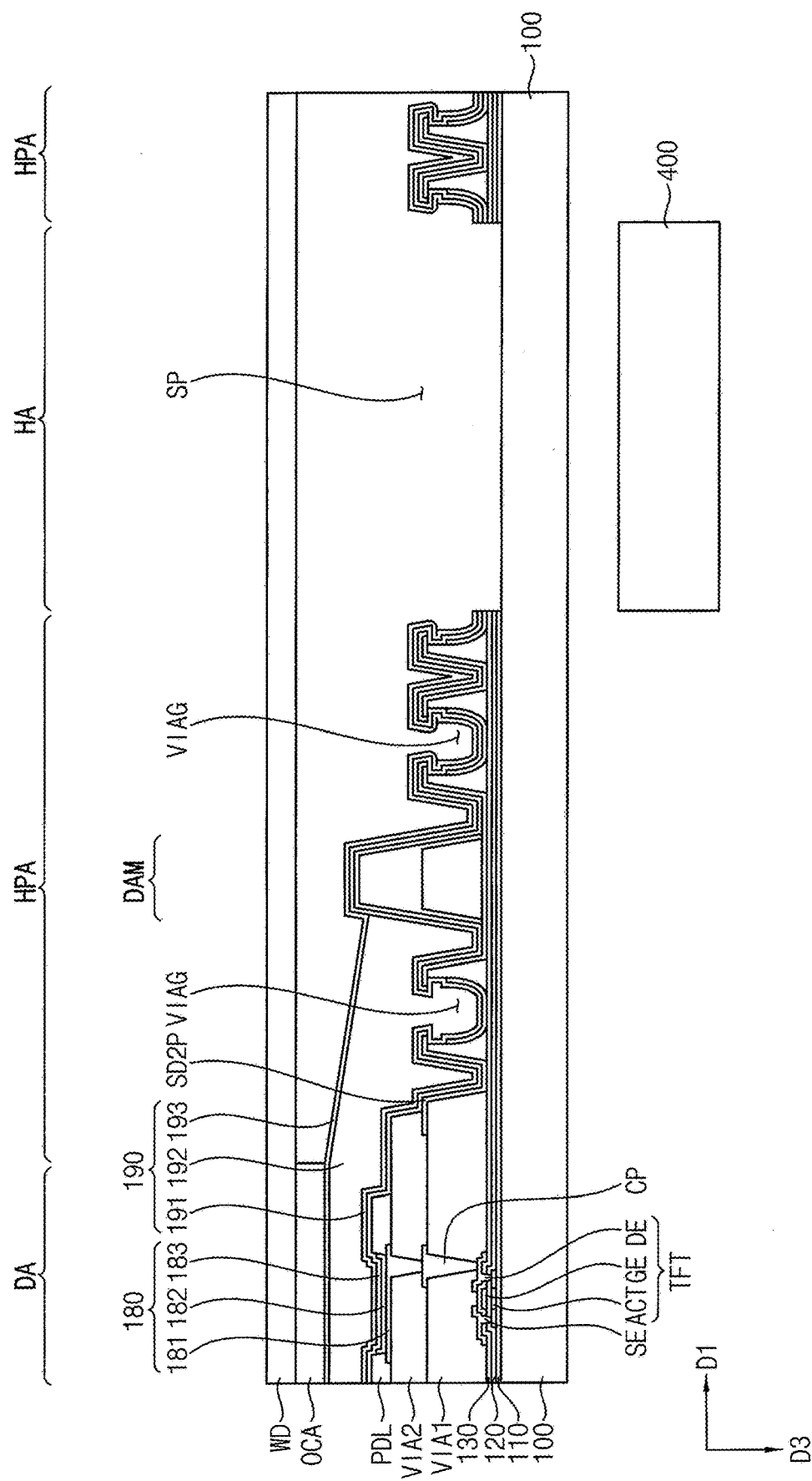
FIG. 5 is a sectional view showing a display apparatus according to another alternative embodiment.

FIG. 5 is a sectional view showing a display apparatus according to another alternative embodiment.

The display apparatus shown in FIG. 5 is substantially the same as the display apparatus of FIG. 2 except that the display apparatus of FIG. 5 further includes an optical clear adhesive film OCA and a cover window WD. The same or like elements shown in FIG. 5 have been labeled with the same reference characters as used above to describe the embodiments of the display apparatus shown in FIG. 2, and any repetitive detailed description thereof will hereinafter be omitted or simplified.

In an embodiment, as shown in FIG. 5, the display apparatus may further include a cover window WD disposed on the thin film encapsulation layer 190, and an optical clear adhesive film OCA disposed between the thin film encapsulation layer 190 and the cover window WD.

The optical clear adhesive film OCA may include an adhesive material such as a transmissive resin and a transmissive film inserted into the adhesive material. In one embodiment, for example, the transmissive resin may be a photo-cured resin. The photo-cured resin may be a material obtained by polymerizing a photocurable resin including a monomer, an oligomer, or the like into a polymer by irradiating light having a specific wavelength to be cured to exhibit adhesive strength. In an embodiment, the photocurable resin may be a material that is cured by irradiating ultraviolet ("UV") rays, but embodiments are not limited thereto. The photocurable resin may include acryl, a (meth)acryl-based compound, or the like. In an embodiment, the photocurable resin may further include a photoinitiator which generates free radicals or ions by photostimulation such as ultraviolet rays. In one embodiment, for example, the photoinitiator include α-hydroxyketone, mono- or bis-acylphosphine oxide, benzophenone, thioxanthone, ketosulfone, benzyl ketal, phenylglyoxylate, borate, titanocene, an oxime ester-based photoinitiator, or the like, but embodiments are not limited thereto.

The base substrate 100 and the cover window WD may be spaced apart from each other in the hole area HA. In such an embodiment, occurrence of an interference phenomenon caused by an air gap SP between the base substrate 100 and the cover window WD may be reduced in the hole area HA since a distance from the top surface of the base substrate 100 to the cover window WD is sufficiently greater than a distance between the base substrate and an encapsulation substrate.

Figure 6:
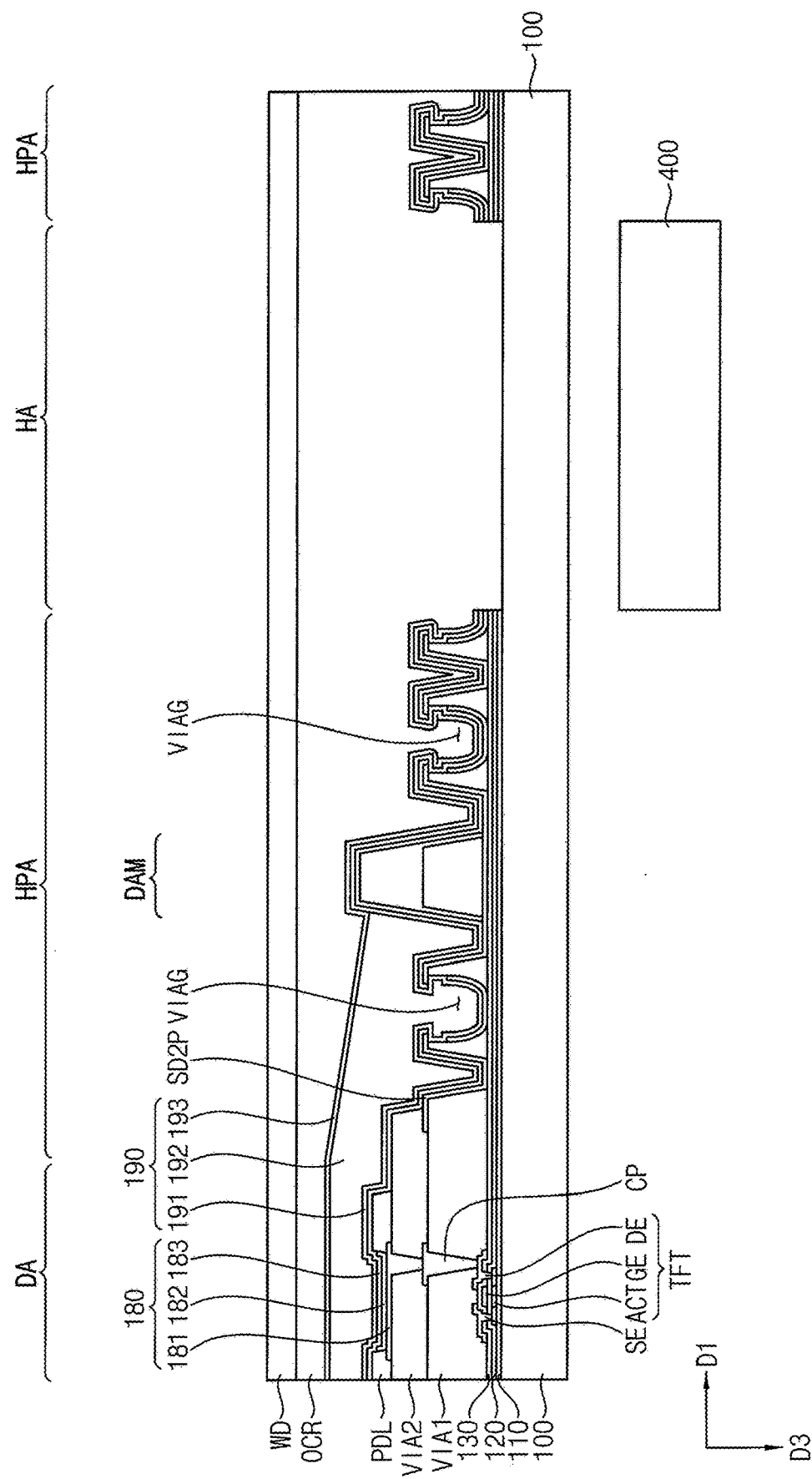
FIG. 6 is a sectional view showing a display apparatus according to another alternative embodiment.

FIG. 6 is a sectional view showing a display apparatus according to another alternative embodiment.

The display apparatus shown in FIG. 6 is substantially the same as the display apparatus of FIG. 5 except that the display apparatus of FIG. 6 includes an optical clear resin OCR instead of the optical clear adhesive film OCA. The same or like elements shown in FIG. 6 have been labeled with the same reference characters as used above to describe the embodiments of the display apparatus shown in FIG. 5, and any repetitive detailed description thereof will hereinafter be omitted or simplified.

In an embodiment, as shown in FIG. 6, the display apparatus may further include a cover window WD disposed on the thin film encapsulation layer 190, and an optical clear resin OCR disposed between the cover window WD and the thin film encapsulation layer 190. The optical clear resin OCR may be disposed between the base substrate 100 and the cover window WD in the hole area HA.

In such an embodiment, there is no air gap between the base substrate 100 and the cover window WD in the hole area HA, such that occurrence of an interference phenomenon caused by the air gap may be reduced in the hole area HA.

The optical clear resin OCR may include an adhesive material such as a transmissive resin. In one embodiment, for example, the transmissive resin may be a photo-cured resin. The photo-cured resin may be a material obtained by polymerizing a photocurable resin including a monomer, an oligomer, or the like into a polymer by irradiating light having a specific wavelength to be cured to exhibit adhesive strength. In an embodiment, the photocurable resin may be a material that is cured by irradiating UV rays, but embodiments are not limited thereto. The photocurable resin may include acryl, a (meth)acryl-based compound, or the like. In an embodiment, the photocurable resin may further include a photoinitiator which generates free radicals or ions by photostimulation such as ultraviolet rays. In one embodiment, for example, the photoinitiator include α-hydroxyketone, mono- or bis-acylphosphine oxide, benzophenone, thioxanthone, ketosulfone, benzyl ketal, phenylglyoxylate, borate, titanocene, an oxime ester-based photoinitiator, or the like, but embodiments are not limited thereto.

Figure 7:
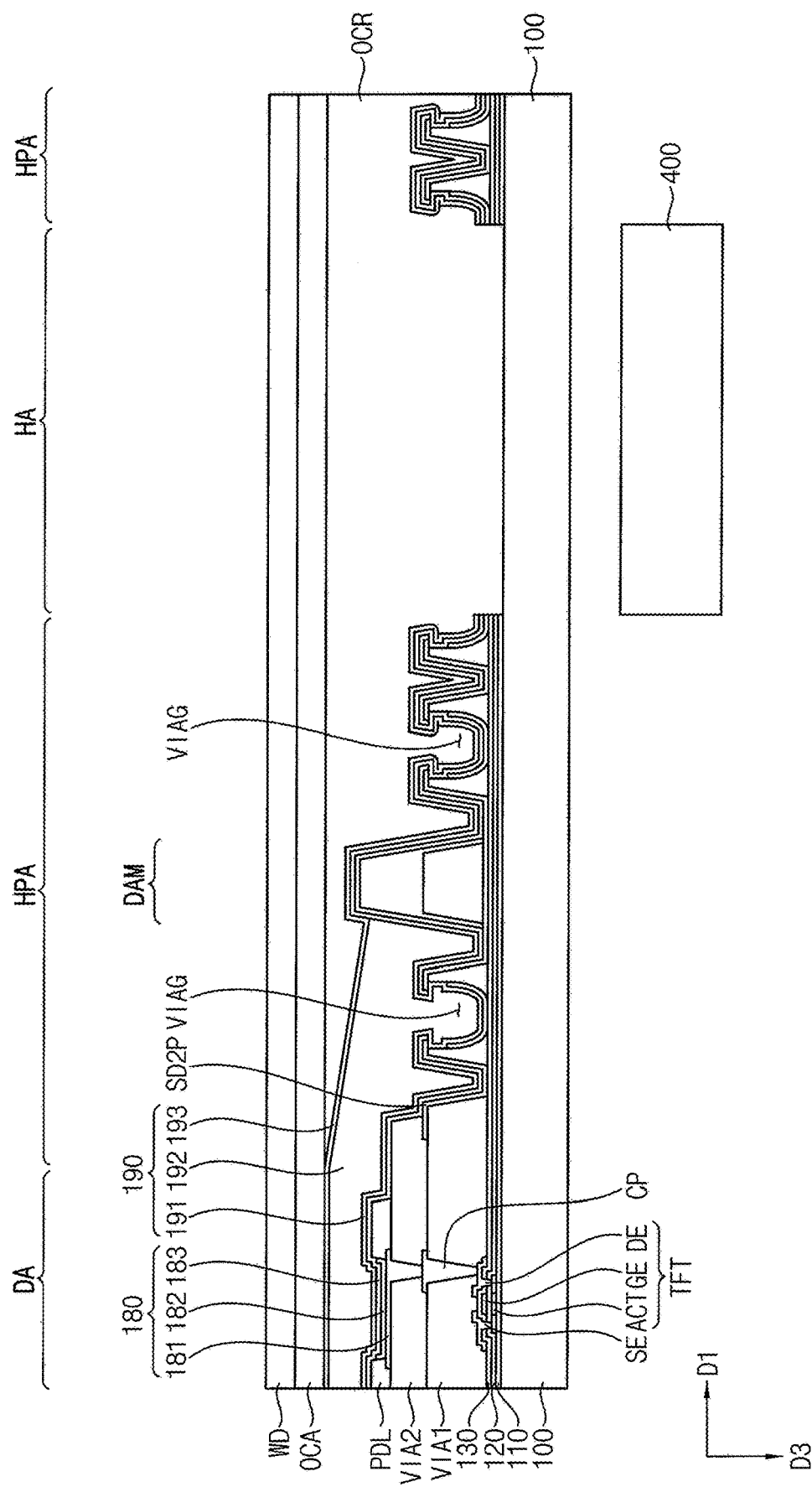
FIG. 7 is a sectional view showing a display apparatus according to another alternative embodiment.

FIG. 7 is a sectional view showing a display apparatus according to another alternative embodiment.

The display apparatus shown in FIG. 7 may be substantially the same as the display apparatus of FIG. 6 except that the display apparatus of FIG. 7 further includes an optical clear adhesive film OCA. The same or like elements shown in FIG. 7 have been labeled with the same reference characters as used above to describe the embodiments of the display apparatus shown in FIG. 6, and any repetitive detailed description thereof will hereinafter be omitted or simplified.

In an embodiment, as shown in FIG. 7, the display apparatus may further include a cover window WD disposed on the thin film encapsulation layer 190, and an optical clear resin OCR and the optical clear adhesive film OCA disposed between the cover window WD and the thin film encapsulation layer 190.

The optical clear resin OCR may be filled in a space between the base substrate 100 and the optical clear adhesive film OCA in the hole area HA and the hole peripheral area HPA. Accordingly, in such an embodiment, there is no air gap between the base substrate 100 and the cover window WD in the hole area HA, such that occurrence of an interference phenomenon caused by the air gap may be reduced in the hole area HA.

Figure 8:
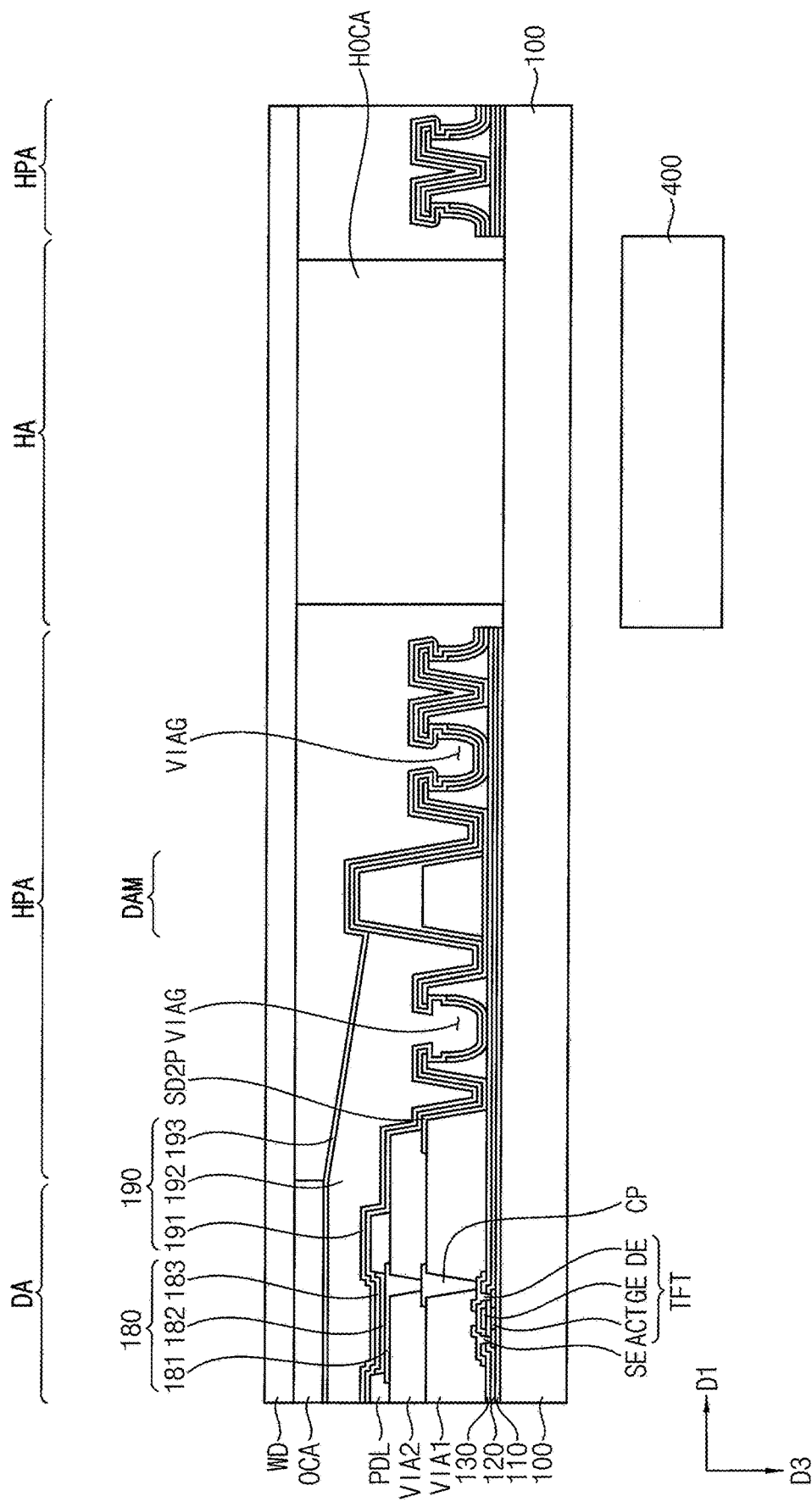
FIG. 8 is a sectional view showing a display apparatus according to another alternative embodiment.

FIG. 8 is a sectional view showing a display apparatus according to another alternative embodiment.

The display apparatus shown in FIG. 8 is substantially the same as the display apparatus of FIG. 5 except that the display apparatus of FIG. 8 further includes a hole optical clear adhesive film HOCA. The same or like elements shown in FIG. 8 have been labeled with the same reference characters as used above to describe the embodiments of the display apparatus shown in FIG. 5, and any repetitive detailed description thereof will hereinafter be omitted or simplified.

In an embodiment, as shown in FIG. 8, the display apparatus may further include a cover window WD disposed on the thin film encapsulation layer 190, and an optical clear adhesive film OCA and a hole optical clear adhesive film HOCA disposed between the cover window WD and the thin film encapsulation layer 190.

The hole optical clear adhesive film HOCA may be disposed between the base substrate 100 and the cover window WD in the hole area HA. Accordingly, there is no air gap between the base substrate 100 and the cover window WD in the hole area HA, such that occurrence of an interference phenomenon caused by the air gap may be reduced in the hole area HA.

Figure 9A:
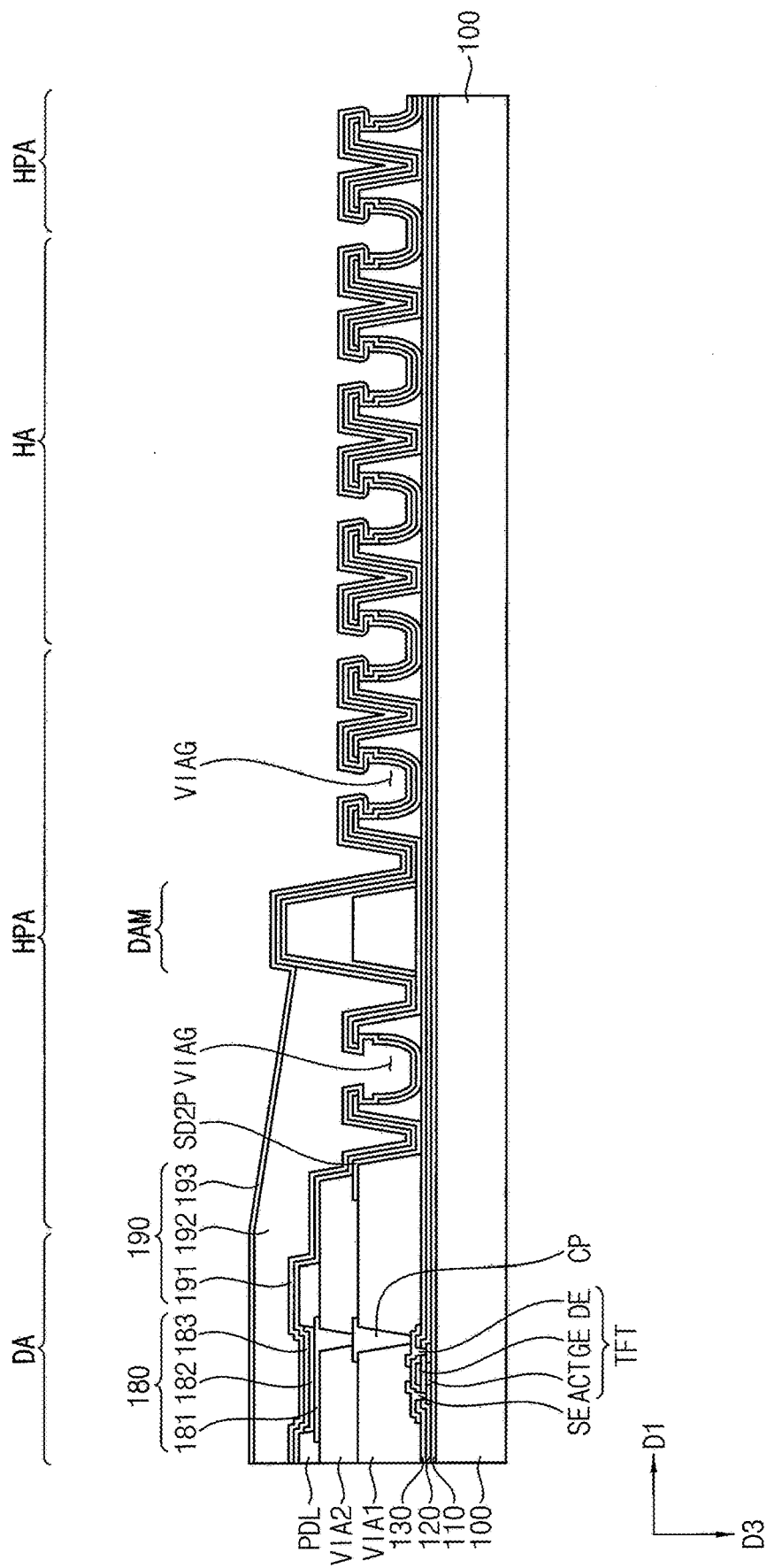
FIGS. 9A and 9B are sectional views showing an embodiment of a method of manufacturing the display apparatus of FIG. 2.
Figure 9B:
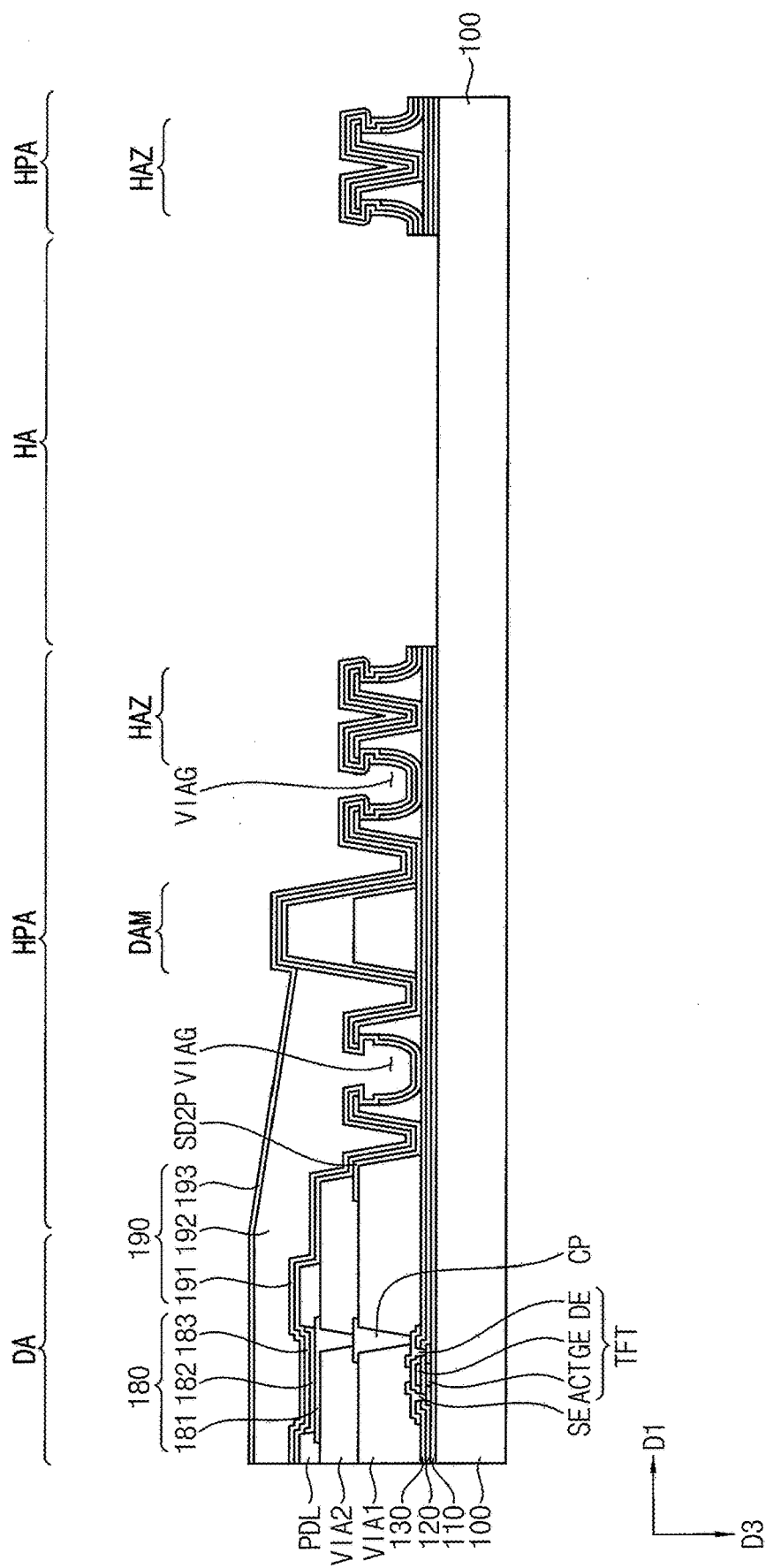

FIGS. 9A and 9B are sectional views showing an embodiment of a method of manufacturing the display apparatus of FIG. 2.

Referring to FIG. 9A, in an embodiment of a method of manufacturing the display apparatus, a buffer layer 110 may be provided or formed on a base substrate 100. An active pattern ACT of a thin film transistor TFT may be provided or formed on the buffer layer 110. A first insulating layer 120 may be provided or formed on the buffer layer 110 on which the active pattern ACT is formed. A gate conductive layer including a gate electrode GE may be provided or formed on the first insulating layer 120. A second insulating layer 130 may be provided or formed on the first insulating layer 120 on which the gate conductive layer is formed. A first source-drain conductive layer including a source electrode SE and a drain electrode DE may be provided or formed on the second insulating layer 130. A first via insulating layer VIA1 having a groove VIAG may be provided or formed in a hole peripheral area HPA on the second insulating layer 130 on which the first source-drain conductive layer is formed. A second source-drain conductive layer including a contact electrode CP and a pattern SD2P may be provided or formed on the first via insulating layer VIA1. A second via insulating layer VIA2 may be provided or formed on the first via insulating layer VIA1 on which the second source-drain conductive layer is formed. A first electrode 181 of a light emitting structure 180 may be provided or formed on the second via insulating layer VIA2. A pixel defining layer PDL may be provided or formed on the second via insulating layer VIA2 on which the first electrode 181 is formed. A light emitting layer 182 and a second electrode 183 of the light emitting structure 180 may be provided or formed on the first electrode 181. A thin film encapsulation layer 190 including a first inorganic film 191, an organic film 192, and a second inorganic film 193 may be provided or formed on the second electrode 183.

Referring to FIG. 9B, a layered structure disposed on the base substrate 100 may be removed in the hole area HA. In one embodiment, for example, the layered structure disposed on the base substrate 100 may be removed by using laser cutting or the like.

In an embodiment, in the process of removing the layered structure disposed on the base substrate 100 in the hole area HA by using a laser or the like, a top surface of the base substrate 100 may be slightly damaged. Accordingly, roughness of the top surface of the base substrate 100 in the hole area HA may be greater than roughness of the surface of the base substrate 100 in the hole peripheral area HPA and the display area DA. In such an embodiment, an amount of the laser processing in the hole area HA may be greater in an outer peripheral portion which is an edge portion of the hole area HA (a portion adjacent to the hole peripheral area) than in a central portion of the hole area HA, such that the roughness may be greater in the outer peripheral portion than in the central portion of the hole area HA.

In an embodiment, in the process of removing the layered structure disposed on the base substrate 100 in the hole area HA by using the laser or the like, heat may affect the layered structure at a portion adjacent to the hole area HA. Accordingly, a heat affected zone HAZ may be formed at a portion making contact with the hole area HA.

In the heat affected zone HAZ, the first via insulating layer VIA1 including an organic insulating material that may be easily deformed by the heat may be thermally deformed to be carbonized or swelled.

Thereafter, a cover window, an optical module, and the like may be additionally provided, so that the display apparatus may be manufactured.

Figure 10A:
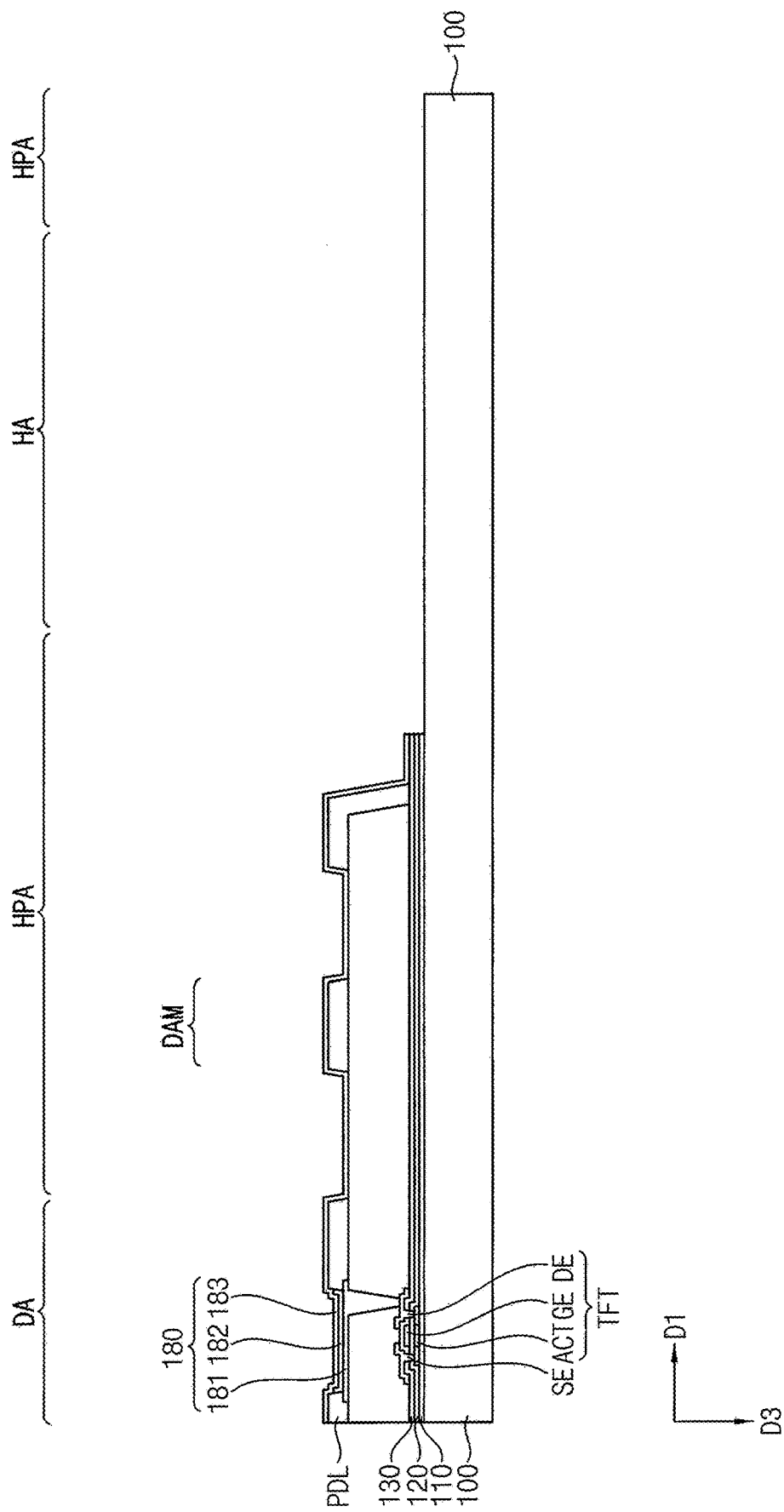
FIGS. 10A to 10C are sectional views showing an embodiment of a method of manufacturing the display apparatus of FIG. 4.
Figure 10B:
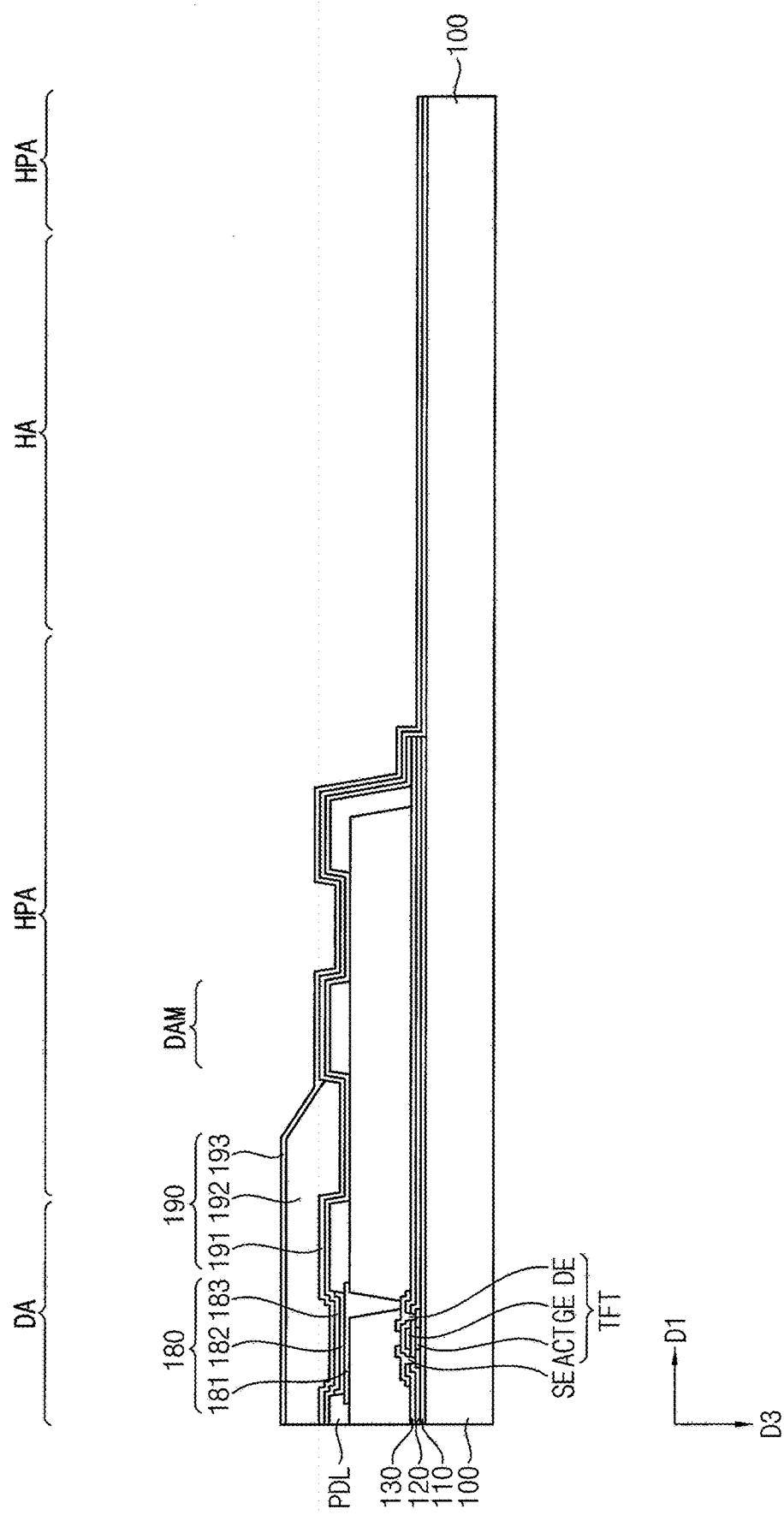
Figure 10C:
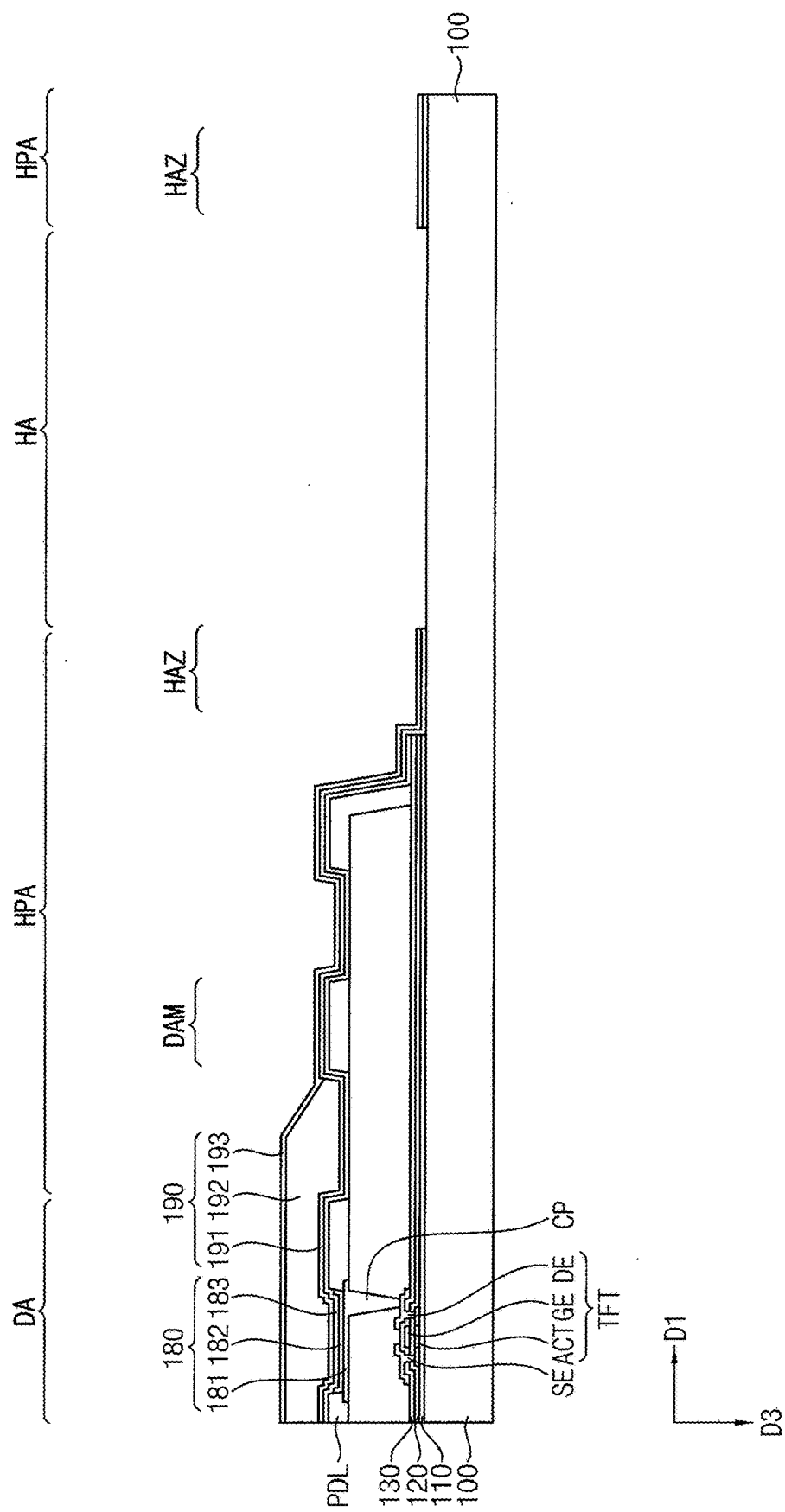

FIGS. 10A to 10C are sectional views showing an embodiment of a method of manufacturing the display apparatus of FIG. 4.

Referring to FIG. 10A, in an embodiment of a method of manufacturing the display device, a buffer layer 110 may be provided or formed on a base substrate 100. An active pattern ACT of a thin film transistor TFT may be provided or formed on the buffer layer 110. A first insulating layer 120 may be formed on the buffer layer 110 on which the active pattern ACT is formed. A gate conductive layer including a gate electrode GE may be provided or formed on the first insulating layer 120. A second insulating layer 130 may be provided or formed on the first insulating layer 120 on which the gate conductive layer is formed. A source-drain conductive layer including a source electrode SE and a drain electrode DE may be formed on the second insulating layer 130. A via insulating layer VIA may be provided or formed on the second insulating layer 130 on which the source-drain conductive layer is formed. A first electrode 181 of a light emitting structure 180 may be provided or formed on the via insulating layer VIA. A pixel defining layer PDL may be formed on the via insulating layer VIA on which the first electrode 181 is formed. A light emitting layer 182 and a second electrode 183 of the light emitting structure 180 may be provided or formed on the first electrode 181.

Thereafter, a layered structure disposed on the base substrate 100 may be removed in the hole area HA and a portion of the hole peripheral area HPA adjacent to the hole area HA. In one embodiment, for example, the layered structure disposed on the base substrate 100 may be removed by using laser cutting or the like.

Referring to FIG. 10B, a thin film encapsulation layer 190 including a first inorganic film 191, an organic film 192, and a second inorganic film 193 may be provided or formed on the second electrode 183 and the base substrate 100.

In such an embodiment, the first inorganic film 191 and the second inorganic film 193 may be directly formed on the base substrate 100 in the hole area HA in which the layered structure disposed on the base substrate 100 is removed by the laser cutting or the like, and a portion of the hole peripheral area HPA adjacent to the hole area HA.

Referring to FIG. 10C, the layered structure disposed on the base substrate 100 may be removed in the hole area HA. In one embodiment, for example, the layered structure disposed on the base substrate 100 may be removed by using the laser cutting or the like.

In such an embodiment, in the process of removing the layered structure disposed on the base substrate 100 in the hole area HA by using a laser or the like, only the first inorganic film 191 and the second inorganic film 193 of the thin film encapsulation layer 190 are disposed in a heat affected zone HAZ in which heat affects the layered structure at a portion adjacent to the hole area HA, such that an influence due to thermal deformation may be minimized.

Thereafter, a cover window, an optical module, and the like may be additionally provided, so that the display apparatus may be manufactured.

Figure 11:
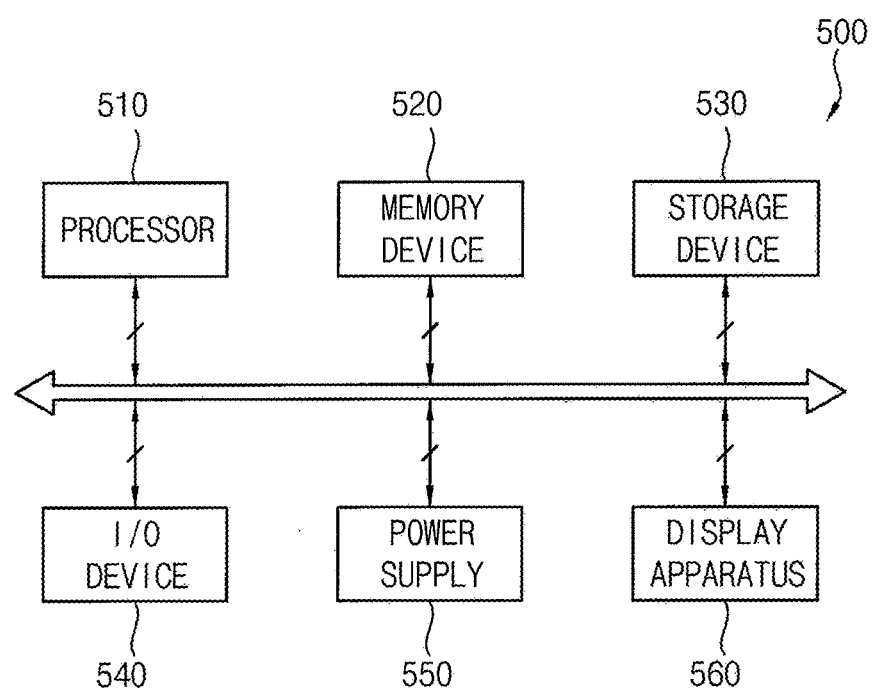
FIG. 11 is a block diagram illustrating an electronic device according to an embodiment.
Figure 12A:
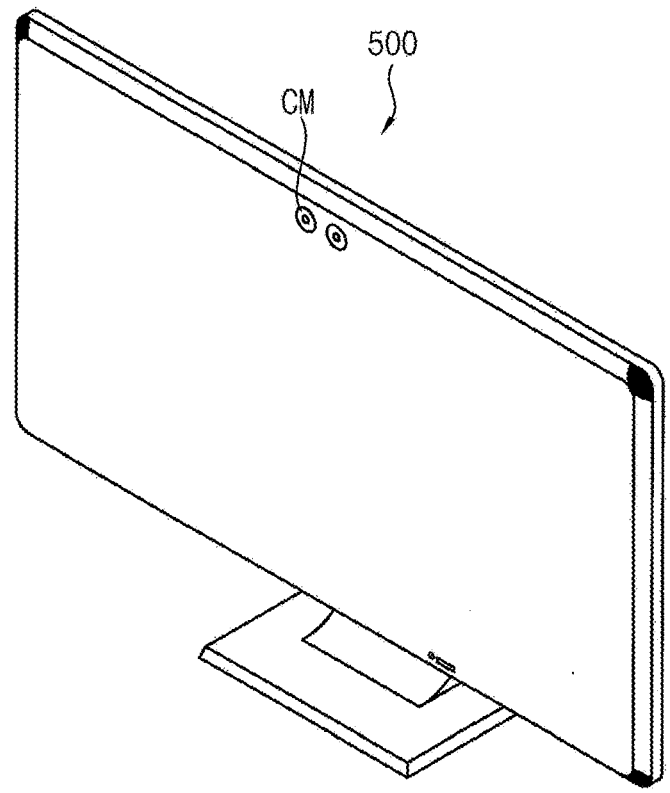
FIG. 12A is a diagram illustrating an embodiment in which the electronic device of FIG. 11 is implemented as a television.
Figure 12B:
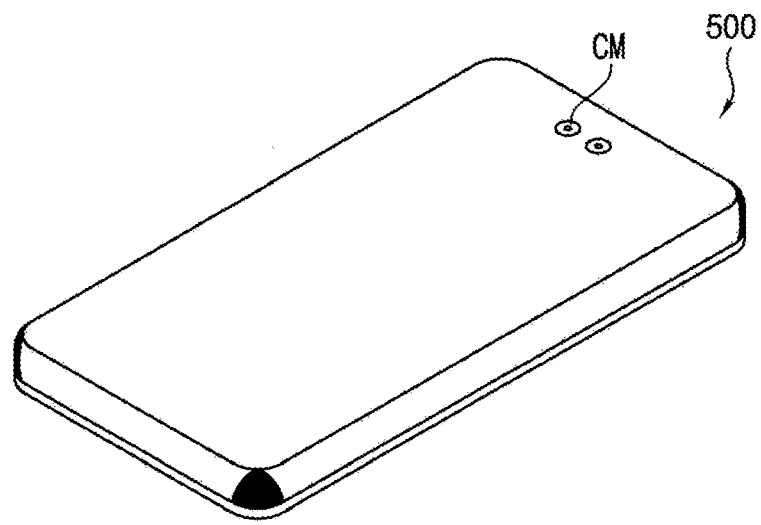
FIG. 12B is a diagram illustrating an embodiment in which the electronic device of FIG. 11 is implemented as a smart phone.

FIG. 11 is a block diagram illustrating an electronic device according to an embodiment, FIG. 12A is a diagram illustrating an embodiment in which the electronic device of FIG. 11 is implemented as a television, and FIG. 12B is a diagram illustrating an embodiment in which the electronic device of FIG. 11 is implemented as a smart phone.

Referring to FIGS. 11 to 12B, an embodiment of the electronic device 500 may include a processor 510, a memory device 520, a storage device 530, an input/output ("I/O") device 540, a power supply 550, and a display apparatus 560. In such an embodiment, the display apparatus 560 may be the display apparatus of FIG. 1. In an embodiment, the electronic device 500 may further include a camera module CM. In an embodiment, the electronic device 500 may further include a plurality of ports for communicating with a video card, a sound card, a memory card, a universal serial bus ("USB") device, other electronic devices, etc. In an embodiment, as illustrated in FIG. 12A, the electronic device 500 may be implemented as a television. In an alternative embodiment, as illustrated in FIG. 12B, the electronic device 500 may be implemented as a smart phone. However, the electronic device 500 is not limited thereto. In one alternative embodiment, for example, the electronic device 500 may be implemented as a cellular phone, a video phone, a smart pad, a smart watch, a tablet personal computer ("PC"), a car navigation system, a computer monitor, a laptop, a head mounted display ("HMD") apparatus, etc.

The processor 510 may perform various computing functions. The processor 510 may be a micro processor, a central processing unit ("CPU"), an application processor ("AP"), etc. The processor 510 may be coupled to other components via an address bus, a control bus, a data bus, etc. In an embodiment, the processor 510 may be coupled to an extended bus such as a peripheral component interconnection ("PCI") bus. The memory device 520 may store data for operations of the electronic device 500. In one embodiment, for example, the memory device 520 may include at least one non-volatile memory device such as an erasable programmable read-only memory ("EPROM") device, an electrically erasable programmable read-only memory ("EE-PROM") device, a flash memory device, a phase change random access memory "(PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile DRAM device, etc. The storage device 530 may include a solid state drive ("SSD") device, a hard disk drive ("HDD") device, a CD-ROM device, etc. The I/O device 540 may include an input device such as a keyboard, a keypad, a mouse device, a touch-pad, a touch-screen, etc, and an output device such as a printer, a speaker, etc. The power supply 550 may provide power for operations of the electronic device 500.

The display apparatus 560 may be coupled to other components via the buses or other communication links. In an embodiment, the I/O device 540 may include the display apparatus 560. In such an embodiment, as described above, the display apparatus 560 may include a base substrate which is a rigid substrate and seal a light emitting layer by using a thin film encapsulation layer while forming a hole area in which an optical module is to be disposed. Accordingly, a manufacturing cost of the display apparatus is reduced and display quality thereof is improved. In such an embodiment, layered structures except for the base substrate are removed from the hole area, so that performance of the optical module can be prevented from deteriorating due to an interference phenomenon or the like caused by an air gap, as described herein.

Embodiments of the invention may include a display apparatus and an electronic device including the display apparatus, e.g., a smart phone, a cellular phone, a video phone, a smart pad, a smart watch, a tablet PC, a car navigation system, a television, a computer monitor, a laptop, a head mounted display apparatus, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
   a base substrate including a hole area through which light passes through the base substrate to or from an optical module disposed under the base substrate, a hole peripheral area which is a non-display area surrounding the hole area which overlaps the optical module, and a display area surrounding the hole peripheral area, wherein the display area includes a plurality of pixels to display an image;
   an insulating layer disposed on the base substrate in the hole peripheral area and the display area except for the hole area;
   a via insulating layer disposed on the insulating layer in the hole peripheral area and the display area except for the hole area;

a pixel defining layer disposed on the via insulating layer in the hole peripheral area and the display area except for the hole area; and a thin film encapsulation layer including a first inorganic film and a second inorganic film, which are disposed in the hole peripheral area and the display area except for the hole area on the base substrate on which the via insulating layer is disposed, wherein the base substrate defines a layer which is disposed between the optical module and the insulating layer, and wherein the optical module is disposed only in the hole area, and wherein the hole area is defined only by opposing ends defining the insulating layer and the thin film encapsulation layer.

2. The display apparatus of claim 1, wherein the base substrate is a rigid substrate.

3. The display apparatus of claim 1, wherein a roughness of a surface of the base substrate in the hole area is greater than a roughness of the surface of the base substrate in the hole peripheral area and the display area.

4. The display apparatus of claim 1, further comprising:
a first electrode disposed on the via insulating layer in the display area;
a light emitting layer disposed on the first electrode; and
a second electrode disposed on the light emitting layer.

5. The display apparatus of claim 4, wherein a groove surrounding the hole area is defined in the via insulating layer in the hole peripheral area.

6. The display apparatus of claim 5, wherein the second electrode has a disconnected portion in the groove of the via insulating layer.

7. The display apparatus of claim 4, wherein the second electrode is spaced apart from the hole area.

8. The display apparatus of claim 7, wherein
the light emitting layer includes a hole injection layer, a hole transport layer, an electron transport layer, and an electron injection layer, which are disposed between the second electrode and the base substrate, wherein the light emitting layer is disposed to correspond to the plurality of pixels, and the hole injection layer, the hole transport layer, the electron transport layer, and the electron injection layer are spaced apart from the hole area.

9. The display apparatus of claim 8, wherein the first inorganic film of the thin film encapsulation layer is disposed directly on the base substrate in the hole peripheral area.

10. The display apparatus of claim 1, wherein
the hole peripheral area includes a heat affected zone at a portion of the hole peripheral area in contact with the hole area, and
the via insulating layer is carbonized in the heat affected zone.

11. The display apparatus of claim 1, wherein
the hole peripheral area includes a heat affected zone at a portion of the hole peripheral area in contact with the hole area, and
wherein a height of the via insulating layer in the heat affected zone is greater than a height of the via insulating layer in the display area and the hole peripheral area.

12. The display apparatus of claim 1, further comprising:
a cover window disposed on the thin film encapsulation layer; and
an optical clear adhesive film disposed between the thin film encapsulation layer and the cover window,
wherein the base substrate and the cover window are spaced apart from each other in the hole area.

13. The display apparatus of claim 12, wherein a hole optical clear adhesive film is disposed between the base substrate and the cover window in the hole area.

14. The display apparatus of claim 1, further comprising:
a cover window disposed on the thin film encapsulation layer; and
an optical clear resin disposed between the cover window and the thin film encapsulation layer,
wherein the optical clear resin is disposed between the base substrate and the cover window in the hole area.

* * * * *